United States Patent [19]

Maehler et al.

[11] Patent Number: 5,777,263

[45] Date of Patent: Jul. 7, 1998

[54] GROUND PLATE ADAPTERS

[75] Inventors: Paul A. Maehler, South Bend, Ind.; Bryan Sholly, El Paso, Tex.

[73] Assignee: Hubbell Incorporated, Orange, Conn.

[21] Appl. No.: 837,490

[22] Filed: Apr. 18, 1997

[51] Int. Cl.⁶ ................................................. H05K 5/02
[52] U.S. Cl. ........................................ 174/51; 248/213.2
[58] Field of Search ............................... 174/51, 35 R, 174/35 GC; 439/95, 97, 96, 101, 92; 220/690, 692, 693; 248/205.1, 223.31, 226.11, 228.7, 229.16, 213.2

[56] References Cited

U.S. PATENT DOCUMENTS

| | | | |
|---|---|---|---|
| 2,956,765 | 10/1960 | Robinson | 248/213.2 |
| 3,477,679 | 11/1969 | Lovitz | 248/213.2 |
| 3,780,209 | 12/1973 | Schuplin | 174/51 |
| 4,835,343 | 5/1989 | Graef et al. | 174/66 |
| 4,978,318 | 12/1990 | Wiley et al. | 439/536 |
| 4,991,803 | 2/1991 | Buder | 248/113 |
| 5,035,646 | 7/1991 | Ehrenfel et al. | 439/536 |
| 5,135,411 | 8/1992 | Wiley et al. | 439/535 |
| 5,285,009 | 2/1994 | Bowmen et al. | 174/48 |

*Primary Examiner*—Bot L. Ledynh
*Assistant Examiner*—Hung V. Ngo
*Attorney, Agent, or Firm*—Jerry M. Presson; Leopold Presser

[57] ABSTRACT

A basic ground plate adapter which is adapted for utilization with wiring devices installable in non-metallic electrical boxes, and in particular, a ground plate adapter which is employable for a single-gang and is selectively connectable to ground plate adapters for constructing multi-gang arrangements as may be required for specific physical and utilitarian applications. The basic ground plate adapter includes a generally inverted U-shaped bracket structure adapted to clampingly engage the edge or rim of the sidewall of a non-metallic or plastic electrical box, and includes a Z-shaped plate arrangement or further bracket attached to the inverted U-shaped bracket structure. The ground plate adapter also includes a threaded aperture for receiving a ground screw. The ganging ground plate adapter, which in overall structural design is similar to the basic ground plate adapter which is normally used for single-gang installations, incorporates a laterally extending arm member having a depending bracket structure at its free or distal end, including a bracket having an aperture formed therein and adapted to be superimposed on or connected to the Z-shaped bracket on the basic ground plate adapter so as to form an interconnected or ganged two-bracket ground plate construction for a two-gang utilization.

9 Claims, 3 Drawing Sheets

GROUND PLATE ADAPTERS

BACKGROUND OF THE INVENTION

1. Field of the Invention

The present invention relates to ground plate adapters which are adapted for utilization with wiring devices installable in non-metallic electrical boxes, and in particular, relates to a basic gangable ground plate adapter which is employable for a single-gang and is connectable to at least one ganging ground plate adapter which comprises a basic ground plate adapter possessing an integral extension arm for constructing multi-gang arrangements as may be required for specific physical and utilitarian applications.

The employment of ground plate adapters for various types of wiring devices, and wherein the adapters are installed in non-metallic electrical receptacles or boxes, such as are preferably constituted of molded plastic materials, is well known in the technology. In those instances, various types and configurations of metallic adapters, such as ground plate adapters, are fastened to the non-metallic boxes or receptacles in order to be able to provide electrical and/or ground connections which are suitable for the specific intended installations of the electrical boxes.

2. Discussion of the Prior Art

Thus, for instance, Wiley et al. U.S. Pat. Nos. 4,978,318 and 5,135,411, which are commonly assigned to the assignee of the present application, and the disclosures of which are incorporated herein by reference, each set forth various kinds of multiple outlet receptacles and mountings therefore, including plate adapters for implementing connections with electrical wiring or differing types of electrical devices.

Basically, the purpose the ground plate is to make electrically contact with a metal strap of a wiring device; for example such as a receptacle or a switch, and then to provide an electrical path to another electrical connection point, for instance, which may be a ground screw hole formed on the ground plate adapter. In many instances, various devices, especially such as switches, do not possess a ground screw on the electrical device itself. The ground plate provides the necessary ground screw attachment point and facilitates electrical continuity to the device strap which may be further connected to a cover, and in the event that the cover is constituted of metal, provides a ground path in order to ground the cover. The purpose, thus, is to provide that ground path connection. In the event that the electrical device possesses its own ground screw, the ground plate still is functional, but is essentially redundant to the electrical device ground screw attache.

In general, the ground plate is functional only when employed in conjunction with and electrical device so it is positioned over the edge or end wall of a box, and the device is positioned on top of the ground plate. The mounting screw of the electrical device is then passed through the strap of the device through the ground plate and into a boss having a threaded aperture and formed in the box, the latter of which is generally constituted of a non-metallic material, such as plastic. Tightening the mounting screw then retains all the components together in fixed position. Another potential application resides in grounding a metal cover which attaches to the box directly with no electrical device being present, such as a blank cover or a wall mount fixture cover. These metal covers do not incorporate any ground screw attachment, and the plastic box cannot provide the ground path. Consequently, the inventive ground plate adapter is utilized to impart that grounding capability.

Other types of ground plate adapters for connection to electrical devices, and which are installable in floor boxes or different types of non-metallic or plastic material housings, are also disclosed in Bowman et al. U.S. Pat. No. 5,285,009, wherein suitable brackets include fastening lugs for attachment to the housing, and other fastening projections for connection to various wiring devices or electrical fixtures.

Similarly, Ehrenfels et al. U.S. Pat. No. 5,035,646, and Graef et al. U.S. Pat. No. 4,835,343 each disclose various types of adapter plates which are suitable for grounding electrical wiring or fixtures, and which may be installed, if necessary, in non-metallic or plastic housing arrangements.

SUMMARY OF THE INVENTION

In order to improve upon the foregoing technology as disclosed in the current state-of-the-art, and to impart a greater degree of versatility to ground plate adapters, specifically such as are designed for use with non-metallic or plastic electrical boxes or receptacles, the present invention is directed to the provision of a ground plate adapter which, pursuant to one embodiment, is designed to be employed on so-called single-gang boxes, through a simple bracket connecting structure. A single bracket forming a part of the ground plate adapter is adapted to be used with a single-gang application when mounted on a non-metallic electrical box.

Pursuant to a modification of the basic ground plate adapter, of which the former is designed to be employed for a single-gang utilization, a similar but modified basic ground plate adapter incorporates an integral extension or projecting arm structure adapted to engage the basic ground plate adapter and to be interconnected therewith or fastened thereto so as to form, in conjunction therewith, a two-bracket or dual bracket structure wherein the addition of the second bracket of the modified ground plate adapter when attached to the basic single-gang ground plate adapter forms a two bracket structure forming a two-gang arrangement.

Through the simple adding on and interconnection in series of additional ganging ground plate adapters each having integral projecting arms by fastening the projecting arm structure thereof to another ground plate adapter, similar or identical in construction to the basic ground plate adapter as described hereinbefore, there can be readily provided three-gang; four-gang, or any number of gangs as required, with the ground plate adapters having the integral projecting arms each being used for each subsequent or extra gang within the confines of the electrical box. This particular simple design and construction of the basic and ganging ground plate adapters readily facilitates the assembling and interconnection of any suitable number of ground plate adapters to each other and for attachment thereof to the electrical box with which they are intended to be employed so as to enable the rapid formation of multi-gang arrangements by the simple addition of other ganging ground plate adapter for each subsequent gang.

Pursuant to the inventive construction, the basic ground plate adapter includes a generally inverted U-shaped bracket structure adapted to clampingly engage the edge or rim of the sidewall of a non-metallic or plastic electrical box, and includes a Z-shaped plate arrangement or further bracket attached to the inverted U-shaped bracket structure, which incorporates suitable apertures to enable fastening thereof to the plastic electrical box through the intermediary of a fastener screw which is insertable into a threaded aperture in a boss formed integrally with the plastic electrical box; and the adapter also includes a further threaded aperture for receiving a ground screw.

The ground plate adapter, which in overall structural design is similar to the basic ground plate adapter which is normally used for single-gang installations, incorporates a laterally extending or projecting arm member having a depending bracket structure at its free or distal end, including a bracket having an aperture formed therein and adapted to be superimposed on or connected to the Z-shaped bracket on the basic ground plate adapter so as to form an interconnected two-bracket ground plate construction for a two-gang utilization, with two axially spaced inverted U-shaped brackets each being clampingly attached to the plastic electrical box and threadingly fastened thereto. In order to expand the foregoing two-gang structure into a multi-gang arrangement, such as three, four, or a larger number of gangs in conformance with the size of the electrical box and with the number of wiring connections required, it is merely necessary to connect further ganging ground plate adapters each having projecting arms in series by means of their brackets located at the free ends of their projecting arms to the preceding ground plate adapter, thereby forming a continuous series or chain of interconnected or ganged ground plate adapters commensurate in quantity with the number of gangs required for the electrical box.

Accordingly, it is an object of the present invention to provide novel and unique ground plate adapters, which are essentially designed for use with non-metallic or plastic electrical boxes, wherein a basic single-gang ground plate adapter is provided with bracket structure engageable with a similarly constructed basic ganging ground plate adapter having an extension arm and bracket matingly connectable therewith so as to, in conjunction therewith, form a two-gang ground plate adapter arrangement; and wherein additional ganging ground plate adapters may be attached in series with each other so as to form a sequence or quantity of interconnected ground plate adapters commensurate with the number of gangs required for a specific electrical box.

BRIEF DESCRIPTION OF THE DRAWINGS

Reference may now be had to the following detailed description of preferred embodiments of ground plate adapters which may be utilized in conjunction with non-metallic or plastic electrical boxes, taken in conjunction with the accompanying drawings; in which.

DETAILED DESCRIPTION OF PREFERRED EMBODIMENTS

Figure 1:
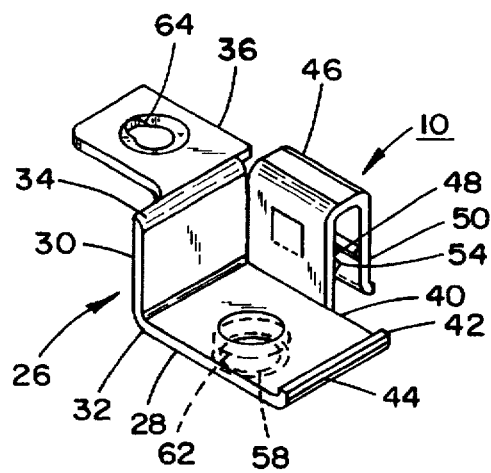
FIG. 1 is a perspective view of a basic ground plate adapter for a single-gang utilization pursuant to the invention.
Figure 3:
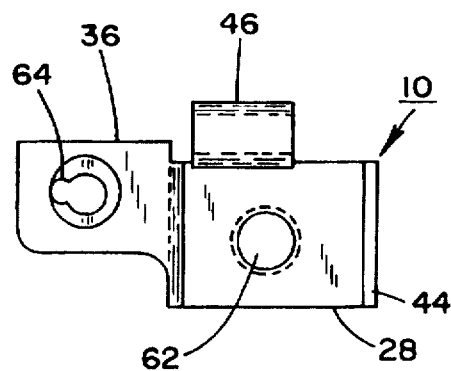
FIG. 3 is a top plan view of the ground plate adapter.
Figure 2:
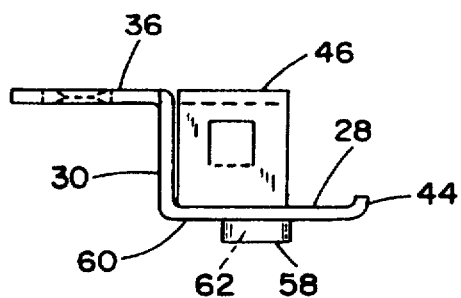
FIG. 2 is a front view of the ground plate adapter of FIG. 1.
Figure 4:
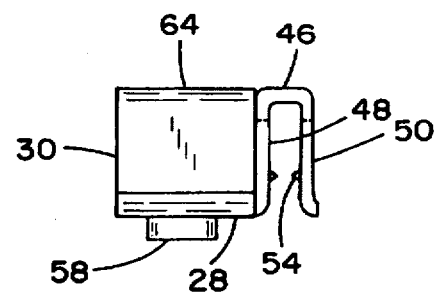
FIG. 4 is an end view of the ground plate adapter.

Referring now in specific detail to FIGS. 1 through 4 of the drawings, there is illustrated a basic ground plate adapter 10 which is utilized for single-gang utilization, as described hereinbefore, in conjunction with electrical wiring devices, such as receptacles or switches which, for instance, may be installed in a suitable non-metallic electrical box, preferably one which is constituted of a molded plastic material, for example, such as a polyvinylchloride or the like, although other non-conductive materials and plastics may be suitable as required for specific physical applications and installations, as described hereinbelow. In this particular instance, referring to FIGS. 9 to 11, the electrical box 12 is of generally rectangular construction having upstanding end walls 14 and side walls 16, and with an open top forming a peripheral edge or rim 18. The box 12 may be equipped with integrally molded internal bosses or uprights 20 each having a threaded aperture 22 at the upper end thereof adapted to receive fastening screws for respectively attaching various components thereto and to each other. The ground plate adapter 10 may be formed from sheet metal or the like, and may be zinc plated, as described in further detail hereinbelow.

As is illustrated in FIGS. 1 through 4 of the drawings, the basic ground plate adapter 10 is adapted to provide a single-gang unit for a wiring connection in the non-metallic or plastic electrical box 12, and includes a generally Z-shaped bracket structure 26 with a first or lower rectangular plate element 28 having an upwardly directed flange or plate 30 extending at right angles at one end 32 thereof, which flange 30, in turn, extends at its upper edge 34 into a further plate element 36 in parallel spaced but oppositely directed relationship with the lower plate element 28.

Attached to or integrally formed with one side edge 40 of the lower plate element 28, the latter of which has an upstanding lip or bead 42 at its free edge 44 opposite end or edge 32, is inverted U-shaped bracket 46 having bracket walls 48, 50 which narrow towards the lower open end 52 thereof, and which may be provided with clamping faces 54 extending towards each other, with the upper rim portion 18 of a wall of the non-metallic or plastic electrical box 12 adapted to be clamped therebetween when mounted thereon, as described hereinbelow.

Extending through the lower plate element 28 and through a boss 58 mounted on the lower surface 60 thereof, is aperture 62 which is threaded within boss 58 for receiving a threaded fastener (not shown) which may be a ground screw. Similarly, a screw threaded aperture 64 extends through the upper plate element 36 for the provision of a connecting location by means of a screw fastener (not shown).

As mentioned, the inverted U-shaped bracket 46 may have protrusions 54 facing inwardly towards each on the inner surfaces of bracket walls 48, 50 so as to provide further gripping engagement with the wall surface of the non-metallic or plastic electrical box 12 on which it is adapted to be mounted. As indicated in the drawing and mentioned hereinbefore, inverted U-shaped mounting or fastening bracket 46 extends upwardly along the one side edge 40 of the lower plate element 28 and at right angles to the upstanding flange 30 at the adjacent edge of the lower plate element to a height which is substantially in correlation or alignment with the upper surface of the upper plate element 36. As illustrated, the entire structure of the ground plate adapter 10 may be either integrally formed from a single metal element, or welded together from separate metal pieces. Preferably, the ground plate adapter is constituted of a suitable steel, and may also be zinc-plated, as is well known in the electrical technology.

Referring to FIGS. 5 through 8 of the drawings, there is disclosed a ganging ground plate adapter 70 which is adapted to be connected with the above-described basic ground plate adapter 10 so as to be able to convert a single-gang unit into an at least two-gang, two-bracket unit, and wherein elements which are similar to or identical with those of the basic ground plate adapter 10 of FIG. 1 are identified by the same reference numerals.

In this embodiment of the ganging ground plate adapter 70, there extends from the upper plate element 36, and coextensive therewith, an elongate extension or projecting arm member 72 of essentially flat sheet metal, which at its end 74 remote from the upstanding inverted U-shaped clamping or mounting bracket 46 includes a downwardly depending plate-like flange 76. The latter has the lower and thereof bent into a flat horizontal plate 78 which is substantially in coplanar relationship with the lower plate element 28 of the ground plate adapter 70; however, in this instance, including having a downwardly bent lip or bead 80 formed so as to extend along the front edge 82 thereof. Provided in the plate 78 is a slotted aperture 84 to enable passage therethrough of a fastener screw to enable attachment to basic ground plate adapter 10, or to a further ganging ground plate adapter 70, as may be required. For the remainder, the ganging ground plate adapter 70 is identical with the first-mentioned basic ground plate adapter 10, as has been described with regard to FIGS. 1 through 4 of the drawings.

Figure 5:
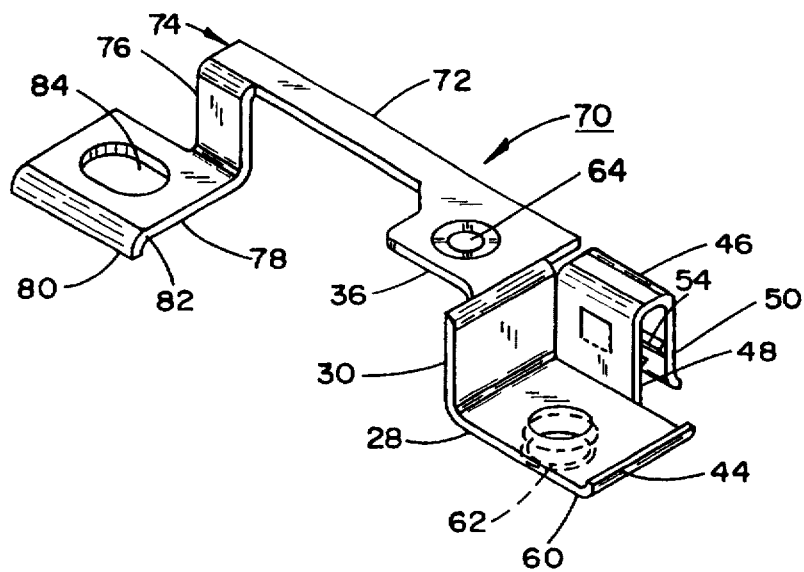
FIG. 5 illustrates a perspective view of a ganging ground plate adapter which incorporates extension arm structure so as to be connectable to the basic ground plate adapter of FIG. 1 in order to provide a two-bracket adapter for multi-gang applications.
Figure 6:
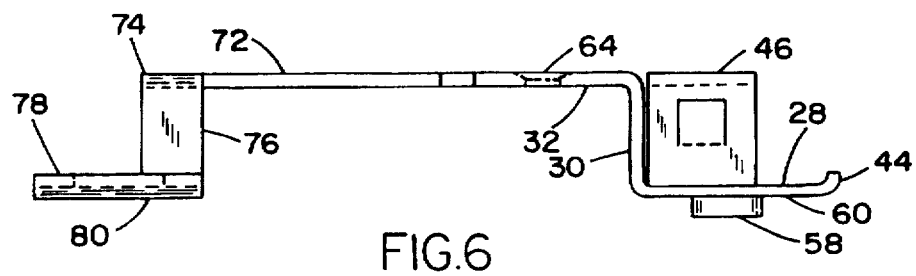
FIG. 6 illustrates a front view of the ganging ground plate adapter of FIG. 5.
Figure 7:
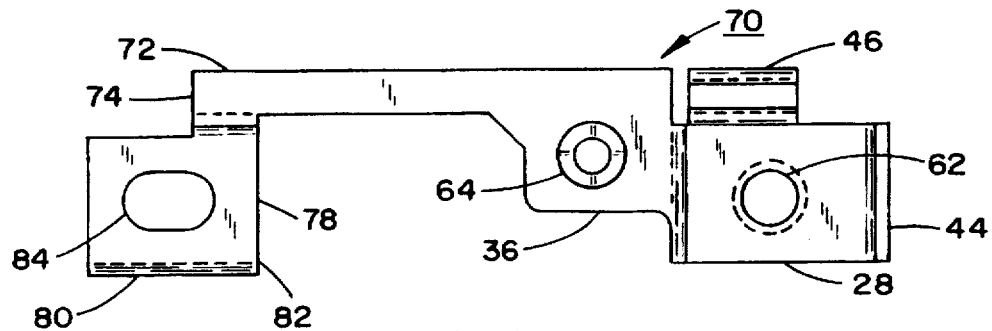
FIG. 7 illustrates a top plan view of the ganging ground plate adapter.
Figure 8:
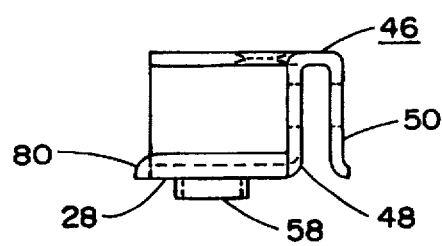
FIG. 8 illustrates an end view of the ganging ground plate adapter.
Figure 9:
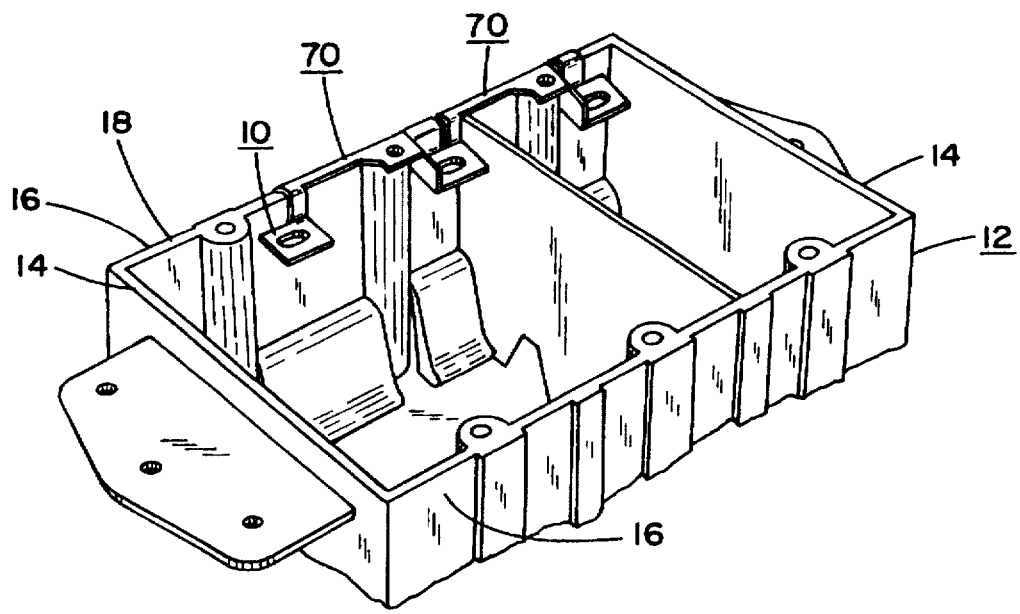
FIG. 9 illustrates a top perspective view of a plurality of basic and ganging ground plate adapters which are interconnected to provide a multi-gang arrangement for an electrical box.
Figure 10:
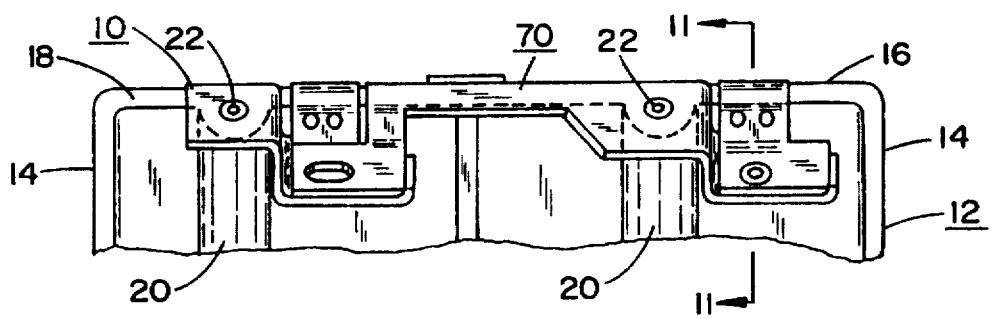
FIG. 10 illustrates a top plan view, in a generally diagrammatic representation, of the arrangement of FIG. 9.
Figure 11:
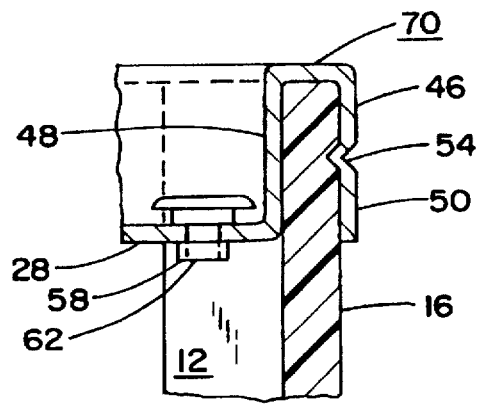
FIG. 11 illustrates, on an enlarged scale, a sectional view taken along line 11—11 in FIG. 10.

Reverting now more specifically to FIGS. 9 through 11 of the drawings, when it is intended to convert a single-gang arrangement formed by the basic ground plate adapter 10 into an arrangement for a multi-gang application; for example, for installation in a non-metallic or plastic electrical box or receptacle 12, with the basic ground plate adapter 10 being shown mounted on the box 12 so that bracket 46 clamps the wall thereof, the plate 78 of the ganging ground plate adapter 70 of FIG. 5, which depends from the free end of projecting arm member 72, is positioned superimposed on the lower plate element 28 on the basic ground plate adapter 10 of FIG. 1 with apertures 62 and 84 being in alignment, and with the beads or lips 42, 44 and 80 assisting in aligning the plate elements with regard to each other, and to prevent a grounding wire to be inserted therebetween and whereby the mounting bracket 46 of the basic ground plate adapter 10 now being adjacent to the flange 76 at the free end of the ganging ground plate adapter 70, with the latter being fastened to the adapter 10 by means of suitable fastener elements, such as a fastener screw (not shown) extending through the slotted aperture 84 in the plate. This, in effect, provides a multi- or two-gang arrangement having an inverted U-shaped clamping bracket 46 at each end, which brackets are adapted to be clampingly engaged over the upper edge or rim of the electrical box 12, at a location where the apertures formed in the upper plate elements 36 of the respective ground plate adapters 10, 70 are superimposed over the threaded apertures 22 in the bosses 20 molded in the plastic or non-metallic electrical box 12. Suitable fastener screws may then be inserted and threaded into the threaded apertures so as to fixedly secure the ground plate adapters 10, 70 in position on the box, with the clamping brackets 46 ensuring that no transverse or lateral end shifting movement can take place relative to the box construction. This, in effect provides the above-described two-gang arrangement formed by interconnected basic and ganging ground plate adapters 10 and 70.

In the event that it is desired to provide further gangs for electrical wiring connections, in effect three or four or even a larger number, depending upon the size of the electrical box 12 and/or quantity of wiring devices, it is merely necessary to attach an additional ganging ground plate adapter 70 to the lower plate element 28 of an adjacent ganging ground plate adapter 70, by superimposing thereon the lower plate 78 at the distal or free end of the extension or projecting arm member 72 of the additional ganging ground plate adapter 70, and using a suitable fastener such as a screw fastener to interconnect the two ground plate adapters 70 which are now attached in line or series, in which instance there would then be present three axially spaced brackets 46 on the electrical box 12; in effect, the bracket on the first or basic ground plate adapter 10, the bracket on the first ganging ground plate adapter 70 having the projecting arm member 72 and which now forms the center clamping bracket 46 and the bracket 46 at the distal end of the additional ganging ground plate adapter 70 which now forms a clamping structure at the opposite end of the entire arrangement.

When it is desired to provide additional gangs; for example, with regard to further wiring devices, it is merely necessary to add ganging ground plate adapters 70 to the end of respectively a previous ganging ground plate adapter 70 and to attach it as heretofore, so as to form a sequence or series of ganged plate adapters in conformance with the required number of gangs for the electrical box.

From the foregoing it becomes readily apparent that in a simple manner, through the use of a basic ground plate adapter 10 employed for a single gang, it is merely necessary to attach one or more ganging ground plate adapters 70 having the connecting arms 72 and attendant structure, so as to provide a series of interconnected ground plate adapters 10, 70 for suitable multi-gang applications. Hereby, it is possible to provide the necessary number of gangs by merely adding and/or subtracting ganging ground plate adapters 70 in conformance with the number of gangs required for any specific application or use. The foregoing provides for a unique and inexpensive arrangement of excellent versatility in being able to modify the number of gangs through the novel basic and ganging ground plate adapters 10, 70 in conjunction with different types of electrical wiring devices and/or non-metallic or plastic electrical boxes 12 without having to modify the overall design and structure thereof, thereby rendering the entire arrangement easily and inexpensively adapted for mass production techniques and installation without the necessity of providing special tooling or other implements for employment by relatively unskilled or semi-skilled labor.

Furthermore, pursuant to a modification of the ganging ground plate adapter 70, in addition to the converted U-shaped bracket 46 it would be possible to also to provide a further inverted U-shaped bracket to the extension arm member 72 which would assist in alignment and attachment of the ground plate adapter when mounted and installed. Inasmuch as such additional bracket can be made from the material of the ground plate adapter which was blanked out and discarded, the use thereof would not require any additional material to be supplied, and thus is extremely inexpensive to produce.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. A ground plate adapter for attachment to at least one single-gang non-metallic electrical box; said ground plate adapter comprising:

(a) an inverted U-shaped bracket member adapted to be clampingly mounted on an upper end of an upstanding wall of an electrical box;

(b) a generally Z-shaped plate structure having an upstanding flange located adjacent one upwardly extending side edge of one wall portion of said bracket member, a lower plate element extending at right angles from a lower edge of said flange and having a side edge fastened to a lower end of said one wall portion of said bracket member, an upper plate element extending from an upper edge of said flange in parallel spaced opposite direction from said upper and lower lower plate element, and an aperture formed in each of said plate elements for the passage therethrough of fastener means.

2. A ground plate adapter as claimed in claim 1, wherein said aperture in said lower plate element is adapted to receive fastener means for forming a grounding connection between said ground plate adapter and at least one wiring device.

3. A ground plate adapter as claimed in claim 1, wherein said aperture in said upper plate element is adapted to receive fastener means for fastening the upper plate element of said ground plate adapter to a structure formed integrally with said electrical box.

4. A ground plate adapter as claimed in claim 1, wherein said bracket member includes mutually facing protruding wall structure for clampingly engaging a wall of said electrical box.

5. A ground plate adapter as claimed in claim 1, wherein said upper plate element further includes an extension arm in coextensive parallel relationship therewith, a depending flange being formed at one edge of said arm in parallel spaced relationship with said one wall portion of said bracket member, a further lower plate element extending at right angles from a lower end of said depending flange so as to be in coplanar spaced relationship with said lower plate element to resultingly form a ganging structure for connection to an additional ground plate adapter; and an aperture in said further lower plate element for receiving fastener means providing a fastening attachment to a lower plate element of the additional ground plate adapter so as to form a two-bracket structure for a two-gang arrangement consisting of the ground plate adapter and the additional ground plate adapter possessing said ganging structure.

6. A ground plate adapter as claimed in claim 5, wherein said lower plate element has an upward bead at an edge thereof opposite said upstanding flange, and the further lower plate element has a depending lip formed at a front edge so that upon superposition onto the lower plate element of the additional ground plate adapter, and a bead of the additional ground plate adapter and said lip of the ground plate adapter are in an interengaged position to facilitate alignment between said lower plate element of the additional ground plate adapter and the further lower plate element of the ground plate adapter.

7. A ground plate adapter as claimed in claim 1, wherein said ground plate adapter is constituted of sheet metal.

8. A ground plate adapter as claimed in claim 1, wherein said ground plate adapter is constituted of steel.

9. A ground plate adapter as claimed in claim 8, wherein said steel ground plate adapter is zinc-plated.

* * * * *